(12) United States Patent
Taniguchi et al.

(10) Patent No.: US 10,911,014 B2
(45) Date of Patent: Feb. 2, 2021

(54) ELECTRONIC COMPONENT

(71) Applicant: Murata Manufacturing Co., Ltd., Nagaokakyo (JP)

(72) Inventors: Tetsuo Taniguchi, Nagaokakyo (JP); Kiyohiro Kashiuchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/596,891

(22) Filed: Oct. 9, 2019

(65) Prior Publication Data
US 2020/0044622 A1 Feb. 6, 2020

Related U.S. Application Data

(63) Continuation of application No. PCT/JP2018/011251, filed on Mar. 22, 2018.

(30) Foreign Application Priority Data

Apr. 25, 2017 (JP) .................................. 2017-086247

(51) Int. Cl.
H03H 7/42 (2006.01)
H03H 7/01 (2006.01)
(Continued)

(52) U.S. Cl.
CPC ....... H03H 7/0115 (2013.01); H01F 27/2804 (2013.01); H01F 27/29 (2013.01);
(Continued)

(58) Field of Classification Search
CPC ... H03H 7/42; H03H 7/01; H03H 7/00; H01P 5/10
(Continued)

(56) References Cited

U.S. PATENT DOCUMENTS 7,859,364 B2 * 12/2010 Sakisaka .................. H03H 7/09
333/185
8,680,950 B2 * 3/2014 Taniguchi ................ H03H 7/09
333/185
(Continued)

FOREIGN PATENT DOCUMENTS

EP 2009787 A1 12/2008
JP 2012-109949 A 6/2012
(Continued)

OTHER PUBLICATIONS

Official Communication issued in International Patent Application No. PCT/JP2018/011251, dated Jun. 5, 2018.

*Primary Examiner* — Dean O Takaoka
(74) *Attorney, Agent, or Firm* — Keating & Bennett, LLP

(57) ABSTRACT

An electronic component includes a first terminal, a second terminal, a first capacitor electrode, a second capacitor electrode, and a third capacitor electrode. The third capacitor electrode is connected to the first terminal. The first capacitor electrode defines a first capacitor along with the third capacitor electrode. The second capacitor electrode defines a second capacitor along with the third capacitor electrode. The second capacitor electrode is connected to the second terminal. A plurality of dielectric layers include a connection layer where a first portion of the first terminal and a second portion of the second terminal are disposed. An inductance of a path from the second capacitor electrode to the second portion is lower than an inductance of a path from the third capacitor electrode to the first portion.

20 Claims, 13 Drawing Sheets

(51) Int. Cl.
  *H01F 27/28* (2006.01)
  *H01F 27/29* (2006.01)
  *H01F 27/40* (2006.01)
  *H01G 4/012* (2006.01)
  *H01G 4/30* (2006.01)
  *H01G 4/40* (2006.01)
  *H01P 5/10* (2006.01)

(52) U.S. Cl.
  CPC ............ *H01F 27/40* (2013.01); *H01G 4/012* (2013.01); *H01G 4/30* (2013.01); *H01G 4/40* (2013.01); *H03H 7/42* (2013.01); *H01F 2027/2809* (2013.01)

(58) Field of Classification Search
  USPC .......................................................... 333/25
  See application file for complete search history.

(56) References Cited

U.S. PATENT DOCUMENTS

| | | | |
|---|---|---|---|
| 2003/0043759 A1* | 3/2003 | Yamaguchi | H04B 5/0012 370/290 |
| 2012/0098622 A1 | 4/2012 | Taniguchi | |
| 2012/0319801 A1 | 12/2012 | Taniguchi | |

FOREIGN PATENT DOCUMENTS

| | | |
|---|---|---|
| WO | 2007/119356 A1 | 10/2007 |
| WO | 2011/114851 A1 | 9/2011 |

* cited by examiner

ELECTRONIC COMPONENT

CROSS REFERENCE TO RELATED APPLICATIONS

This application claims the benefit of priority to Japanese Patent Application No. 2017-086247 filed on Apr. 25, 2017 and is a Continuation Application of PCT Application No. PCT/JP2018/011251 filed on Mar. 22, 2018. The entire contents of each application are hereby incorporated herein by reference.

BACKGROUND OF THE INVENTION

1. Field of the Invention

The present invention relates to an electronic component for processing high-frequency signals in which a plurality of dielectric layers are laminated.

2. Description of the Related Art

Electronic components for processing high-frequency signals in which a plurality of dielectric layers are laminated are known. For example, International Publication No. 2007/119356 discloses a multilayer band pass filter.

In an actual electronic component, a parasitic inductor is formed at a signal path. The higher the frequency f of a signal passing through the inductor, the higher the impedance ($L \cdot 2\pi f$) of an inductor having the inductance L. The impedance of the parasitic inductor therefore increases with the increase in frequency processed by the electronic component. As a result, signal transmission may be delayed in the electronic component and the characteristics of the electronic component may deviate from desired characteristics.

For example, in the multilayer band pass filter disclosed in International Publication No. 2007/119356, a grounding terminal extending on the top, side, and bottom surfaces of the multilayer band pass filter is provided. The grounding terminal can be regarded as a signal path with a length that is substantially equal to the thickness of the dielectric layers in a lamination direction. An inductance increases with the increase in the length of an inductor and the decrease in the thickness of the inductor. In the multilayer band pass filter for processing high-frequency signals, a non-negligible parasitic inductor may therefore be formed at the grounding terminal. As a result, the characteristics of the multilayer band pass filter may deviate from desired characteristics.

SUMMARY OF THE INVENTION

Preferred embodiments of the present invention are able to reduce or prevent the deviation of the characteristics of an electronic component from desired characteristics.

An electronic component according to aspect a preferred embodiment of the present invention is a laminate in which a plurality of dielectric layers are laminated in a lamination direction. The electronic component includes a first terminal, a second terminal, a common capacitor electrode portion, a first capacitor electrode, and a second capacitor electrode. The common capacitor electrode portion is connected to the first terminal. The second capacitor electrode is connected to the second terminal. The common capacitor electrode portion includes a third capacitor electrode connected to the first terminal. The first capacitor electrode defines a first capacitor along with the third capacitor electrode. The second capacitor electrode defines a second capacitor along with the third capacitor electrode. The dielectric layers include a connection layer where a first portion of the first terminal and a second portion of the second terminal are disposed. An inductance of a path from the second capacitor electrode to the second portion is lower than an inductance of a path from the third capacitor electrode to the first portion.

In an electronic component according to aspect a preferred embodiment of the present invention, an inductance of the path from the second capacitor electrode to a second portion of the second terminal disposed at the connection layer is lower than an inductance of the path from the third capacitor electrode to a first portion of the first terminal disposed at the connection layer. A second impedance of a parasitic inductor defined at the signal path from the second capacitor electrode to the second portion is lower than a first impedance of a parasitic inductor defined at the path from the third capacitor electrode to the first portion. Even in the case where a frequency processed by the electronic component increases, the first impedance increases, and the transmission of a signal from the third capacitor electrode to the first portion is delayed, the signal is transmitted to the second portion via the second capacitor provided by the second capacitor electrode and the third capacitor electrode because the second impedance is lower than the first impedance. By causing the second terminal to also define and function as the first terminal, the signal path from the second capacitor electrode to the second portion functions as an alternative to the signal path from the third capacitor electrode to the first portion. Consequently, the delay in signal transmission in the electronic component is reduced or prevented.

An electronic component according to a preferred embodiment of the present invention is a laminate in which a plurality of dielectric layers are laminated in a lamination direction. The electronic component includes a first terminal, a second terminal, a common capacitor electrode portion, a first capacitor electrode and a second capacitor electrode. The common capacitor electrode portion is connected to the first terminal. The second capacitor electrode is connected to the second terminal. The common capacitor electrode portion includes a third capacitor electrode and a fourth capacitor electrode. The third capacitor electrode is connected to the first terminal. The fourth capacitor electrode is connected to the third capacitor electrode. The first capacitor electrode defines a first capacitor along with the third capacitor electrode. The second capacitor electrode defines a second capacitor along with the fourth capacitor electrode. The dielectric layers include a connection layer where a first portion of the first terminal and a second portion of the second terminal are disposed. A sum of an inductance of a path from the third capacitor electrode to the fourth capacitor electrode and an inductance of a path from the second capacitor electrode to the second portion is lower than an inductance of a path from the third capacitor electrode to the first portion.

In an electronic component according to a preferred embodiment of the present invention, the sum of an inductance of the path from the third capacitor electrode to the fourth capacitor electrode and the inductance of the path from the second capacitor electrode to the second portion of the second terminal disposed at the connection layer is lower than that of the path from the third capacitor electrode to the first portion of the first terminal disposed at the connection layer. A fourth impedance, which is a combined impedance of the impedance of a parasitic inductor defined at the signal path from the third capacitor electrode to the fourth capacitor electrode and the inductance of a parasitic inductor defined at the signal path from the second capacitor electrode to the second portion, is lower than a third impedance of a parasitic inductor defined at the signal path from the third capacitor electrode to the first portion. Even in the case where a frequency processed by the electronic component increases, the third impedance increases, and the transmission of a signal from the third capacitor electrode to the first portion is delayed, the signal is transmitted to the second portion via the second capacitor provided by the second capacitor electrode and the fourth capacitor electrode because the fourth impedance is lower than the third impedance. By causing the second terminal to also serve as the first terminal, the signal path from the second capacitor electrode to the second portion functions as an alternative to the signal path from the third capacitor electrode to the first portion. Consequently, the delay in signal transmission in the electronic component is reduced or prevented.

The term "the inductance of a path" means the inductance of a parasitic inductor defined at the path.

With electronic components according to preferred embodiments of the present invention, the deviation of the characteristics of the electronic component from desired characteristics can be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
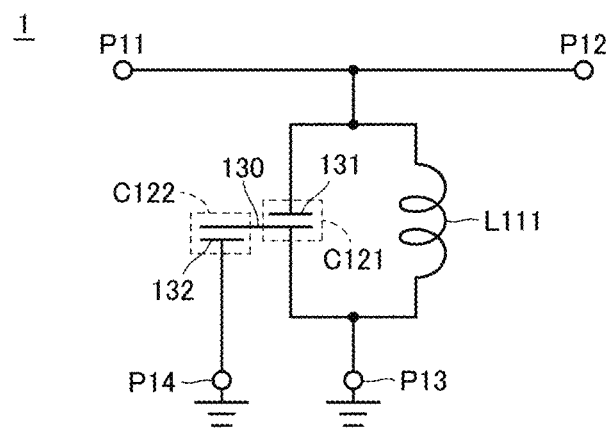
FIG. 1 is an equivalent circuit diagram of a band pass filter that is an example of an electronic component according to a first preferred embodiment of the present invention.

Preferred embodiments of the present invention will be described in detail below with reference to the accompanying drawings. In the drawings, the same reference numerals are used to represent the same or equivalent portions.

First Preferred Embodiment

FIG. 1 is an equivalent circuit diagram of a band pass filter 1 that is an example of an electronic component according to a first preferred embodiment of the present invention. As illustrated in FIG. 1, the band pass filter 1 includes terminals P11 to P14, an inductor L111, and capacitor electrodes 130 to 132.

The terminal P11 is connected to the terminal P12, the capacitor electrode 131, and the inductor L111. The terminals P11 and P12 are input/output terminals.

The inductor L111 is connected between the capacitor electrode 131 and the terminal P13. The capacitor electrode 130 is connected to the terminal P13. The capacitor electrode 132 is connected to the terminal P14. The terminals P13 and P14 are grounding terminals connected to the ground.

The capacitor electrode 131 defines a capacitor C121 along with the capacitor electrode 130. The capacitor electrode 132 defines a capacitor C122 along with the capacitor electrode 130. In order to emphasize a common capacitor electrode portion that is one feature of a preferred embodiment of the present invention, an electrode commonly used by the capacitors C121 and C122 is illustrated as the capacitor electrode 130 in the equivalent circuit diagram in FIG. 1. This illustration is also provided in FIGS. 6, 10, 17, and 18.

The inductor L111 and the capacitor C121 are connected in parallel with each other between the terminals P11 and P13, and define an LC parallel resonator. The resonant frequency of the LC parallel resonator is defined as f160.

The inductance of the path from the capacitor electrode 132 to the point of connection between the ground and the terminal P14 is lower than that of the path from the capacitor electrode 130 to the point of connection between the ground and the terminal P13. The inductance of a path is proportional to the length of the path. Accordingly, there is no need to directly measure the inductance of a path. The magnitude relationship between the inductances of paths can be understood by measuring the lengths of the paths.

Figure 2:
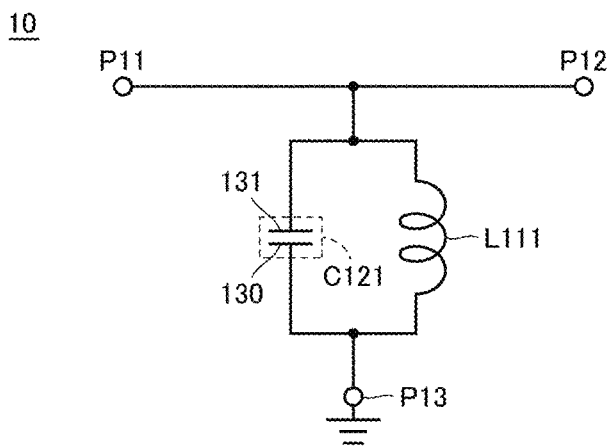
FIG. 2 is an equivalent circuit diagram of a band pass filter that is comparative example embodiment of the present invention.

FIG. 2 is an equivalent circuit diagram of a band pass filter 10 that is comparative example. The band pass filter 10 differs from the band pass filter 1 illustrated in FIG. 1 in that the terminal P14 and the capacitor electrode 132 in the band pass filter 1 are not included. The remaining configuration of the band pass filter 10 is the same or substantially the same as that of the band pass filter 1, and the description thereof will therefore be omitted.

Figure 3:
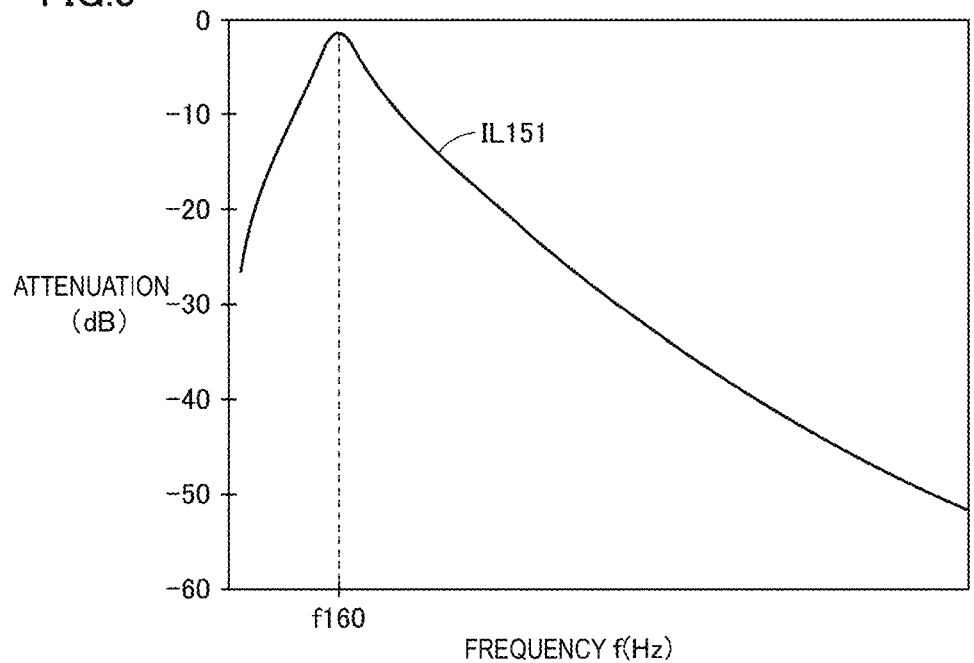
FIG. 3 is a diagram illustrating the insertion loss of the band pass filter illustrated in FIG. 2.

FIG. 3 is a diagram illustrating an insertion loss IL151 of the band pass filter 10 illustrated in FIG. 2. In FIG. 3, the vertical axis represents an attenuation (dB) using negative values. The larger the absolute value of an attenuation, the smaller the insertion loss IL151. The insertion loss IL151 is the proportion of signals transmitted to the terminal P12 in signals input into the terminal P11. The same can be said for an insertion loss IL152 in FIG. 5, an insertion loss IL153 in FIG. 7, and an insertion loss IL154 in FIG. 8. An insertion loss is an indicator representing the proportion of signals transmitted to another terminal in signals input into a certain terminal. The larger the insertion loss, the larger the proportion of signals lost in an electronic component in signals input into the electronic component.

Descriptions will be provided with reference to FIGS. 2 and 3. In the frequency band illustrated in FIG. 3, the insertion loss IL151 is the minimum at the resonant frequency f160 and increases with distance from the resonant frequency f160. The impedance of the LC parallel resonator defined by the inductor L111 and the capacitor C121 becomes very high (approaches infinity) at frequencies near the resonant frequency f160. At frequencies near the resonant frequency f160, the majority of signals from the terminal P11 cannot pass through the LC parallel resonator. Since the proportion of signals transmitted to the terminal P12 in signals transmitted from the terminal P11 becomes the maximum, the insertion loss IL151 becomes the minimum at a frequency near the resonant frequency f160.

The impedance of the inductor L111 increases with the increase in a frequency f. On the other hand, the impedance ($1/(C \cdot 2\pi f)$ where C represents the capacitance of the capacitor C121) of the capacitor C121 decreases with the increase in the frequency f. At the frequencies f higher than the resonant frequency f160, the impedance of the LC parallel resonator defined by the inductor L111 and the capacitor C121 is small because the effect of the decrease in the impedance of the capacitor C121 is greater than the effect of the increase in the impedance of the inductor L111. As a result, signals from the terminal P11 can easily pass through the capacitor C121. The proportion of signals transmitted to the terminal P12 in signals transmitted from the terminal P11 decreases and the insertion loss IL151 increases. In the band pass filter 10, desired characteristics required for band pass filters are achieved in which signals of frequencies near the frequency f160 (pass band) easily pass therethrough and out-of-band signals are less likely to pass therethrough.

In actual band pass filters, parasitic inductors are defined at signal paths. The higher the frequency processed by a band pass filter, the higher the impedance of a parasitic inductor. As a result, signal transmission may be delayed in the band pass filter and the characteristics of an electronic component may deviate from desired characteristics.

Figure 4:
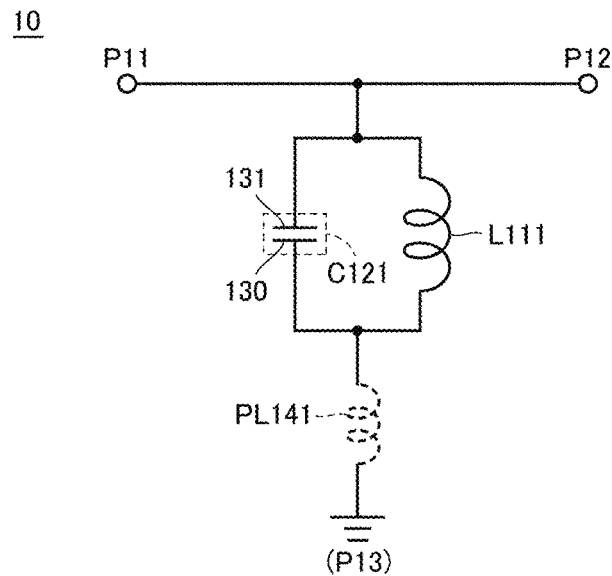
FIG. 4 is an equivalent circuit diagram of the band pass filter in FIG. 2 in which a parasitic inductor defined at a signal path from a capacitor electrode to a point of connection between the ground and a grounding terminal is illustrated.

FIG. 4 is an equivalent circuit diagram of the band pass filter 10 in FIG. 2 in which a parasitic inductor PL141 defined at a signal path from the capacitor electrode 130 to the point of connection between the ground and the grounding terminal P13 is illustrated. As illustrated in FIG. 4, the capacitor C121 and the parasitic inductor PL141 define an LC series resonator. The resonant frequency of the LC series resonator is defined as a frequency f161 (>f160).

Figure 5:
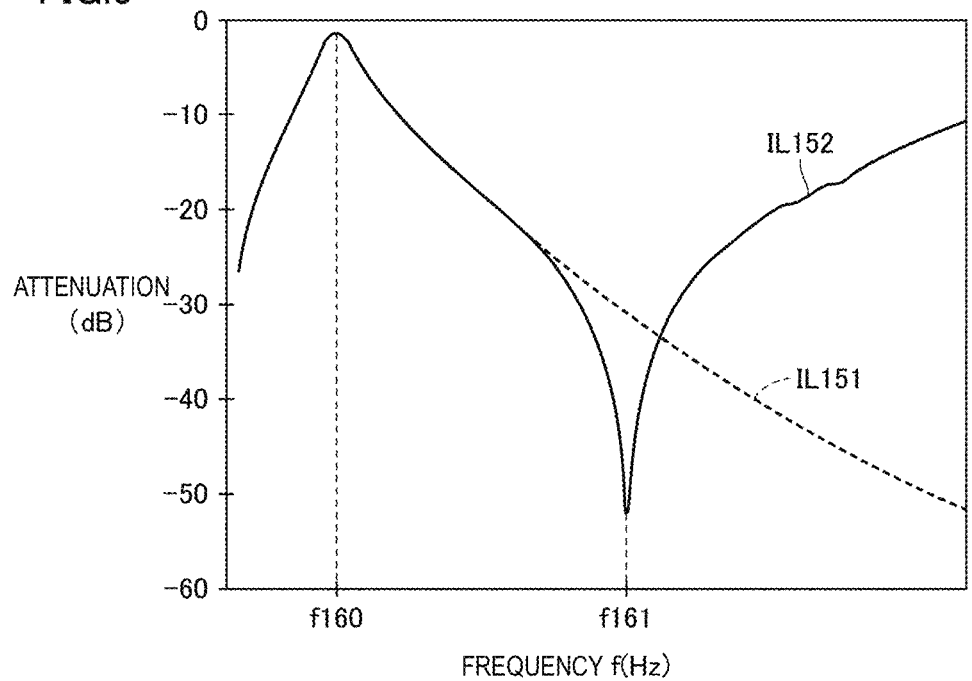
FIG. 5 is a diagram illustrating the insertion loss of the band pass filter in FIG. 4 and the insertion loss in FIG. 3.

FIG. 5 is a diagram illustrating the insertion loss IL152 of the band pass filter 10 in FIG. 4 and the insertion loss IL151 in FIG. 3. In the frequency band illustrated in FIG. 5, similar to the insertion loss IL151, the insertion loss IL152 is the minimum at a frequency near the resonant frequency f160 and increases with the increase in the frequency f in the range from a frequency near the resonant frequency f160 to a frequency near the resonant frequency f161. However, the insertion loss IL152 is the maximum at a frequency near the resonant frequency f161 and decreases in the range of the frequencies f higher than the resonant frequency f161.

The impedance of the LC series resonator defined by the capacitor C121 and the parasitic inductor PL141 in FIG. 4 is very low (approaches 0) at the resonant frequency f161. At frequencies near the resonant frequency f161, signals from the terminal P11 can easily pass through the LC series resonator. The portion of signals transmitted to the terminal P12 in signals transmitted from the terminal P11 is the minimum. Accordingly, the insertion loss IL152 is the maximum at a frequency near the resonant frequency f161.

At the frequencies f higher than the resonant frequency f161, the effect of the increase in the impedance of the parasitic inductor PL141 is greater than the effect of the decrease in the impedance of the capacitor C121. The impedance of the LC series resonator defined by the capacitor C121 and the parasitic inductor PL141 therefore increases. As a result, signals transmitted from the terminal P11 are less likely to pass through the LC series resonator. The proportion of signals transmitted to the terminal P12 in signals transmitted from the terminal P11 increases and the insertion loss IL152 decreases. In the band pass filter 10 in which the parasitic inductor PL141 is taken into consideration, a frequency band in which the insertion loss IL152 is as small as that in the pass band may occur. Similar to signals in the pass band, signals in this frequency band easily pass through the band pass filter 10. The characteristics of the band pass filter 10 in which the parasitic inductor PL141 is taken into consideration deviate from desired characteristics in which signals in a frequency band other than the pass band are less likely to pass through the band pass filter.

In the band pass filter 1, the capacitor C122 is defined by the capacitor electrode 130 connected to the grounding terminal P13 and the capacitor electrode 132 connected to the grounding terminal P14 different from the grounding terminal P13.

Figure 6:
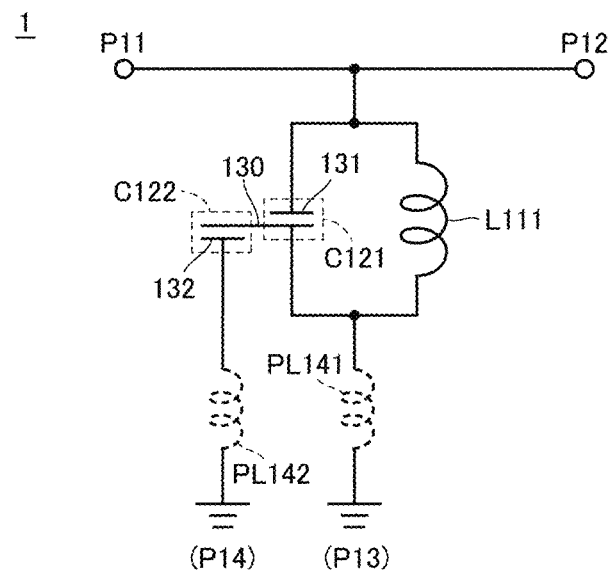
FIG. 6 is an equivalent circuit diagram of the band pass filter in FIG. 1 in which a parasitic inductor defined at a signal path from a capacitor electrode to a point of connection between the ground and a grounding terminal is illustrated.

FIG. 6 is an equivalent circuit diagram of the band pass filter 1 in FIG. 1 in which the parasitic inductor PL141 defined at the signal path from the capacitor electrode 130 to the point of connection between the ground and the terminal P13 and a parasitic inductor PL142 defined at the signal path from the capacitor electrode 132 to the point of connection between the ground and the terminal P14 are illustrated. The inductance of the path from the capacitor electrode 132 to the point of connection between the ground and the terminal P14 is lower than the inductance of the path from capacitor electrode 130 and the point of connection between the ground and the terminal P13. That is, the inductance of the parasitic inductor PL142 is lower than that of the parasitic inductor PL141.

Figure 7:
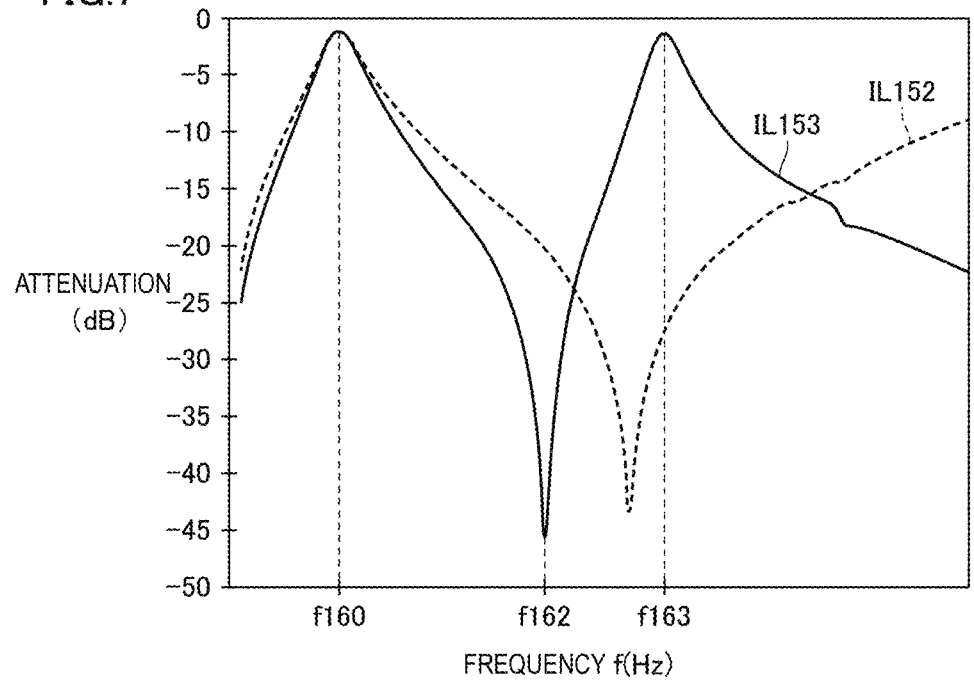
FIG. 7 is a diagram illustrating the insertion loss of the band pass filter in FIG. 6 and the insertion loss in FIG. 4.

FIG. 7 is a diagram illustrating the insertion loss IL153 of the band pass filter 1 in FIG. 6 and the insertion loss IL152 of the band pass filter 10 in FIG. 4. In the frequency band illustrated in FIG. 7, the insertion loss IL153 is the minimum at a frequency near the resonant frequency f160 similar to the insertion loss IL152 and increases with the increase in the frequency f in the range from the frequency f160 to a frequency f162. The insertion loss IL153 is the maximum at the frequency f162 and decreases with the increase in the frequency f in the range from the frequency f162 to a frequency f163. The change in the insertion loss IL153 in the range of frequencies lower than the frequency f163 is the same or substantially the same as the change in the insertion loss IL152 in the frequency band illustrated in FIG. 5.

However, the insertion loss IL153 is the minimum at the frequency f163. In the range of the frequencies f higher than the frequency f163, the insertion loss IL153 increases with the increase in the frequency f.

Referring to FIG. 6, the impedance of the parasitic inductor PL141 increases with the increase in the frequency f. The transmission of a signal from the capacitor electrode 130 to the point of connection between the ground and the terminal P13 may be delayed. Since the impedance of the parasitic inductor PL142 is lower than that of the parasitic inductor PL141, a signal is transmitted from the capacitor electrode 130 to the point of connection between the ground and the terminal P14 via the capacitor C122 defined by the capacitor electrodes 130 and 132. The signal path from the capacitor electrode 132 to point of connection between the ground and the terminal P14 defines and functions as an alternative to the signal path from the capacitor electrode 130 to the point of connection between the ground and the terminal P13. The delay in signal transmission in the band pass filter 1 is therefore reduced or prevented. As a result, the deviation of the characteristics of the band pass filter 1 from desired characteristics can be reduced or prevented.

Figure 8:
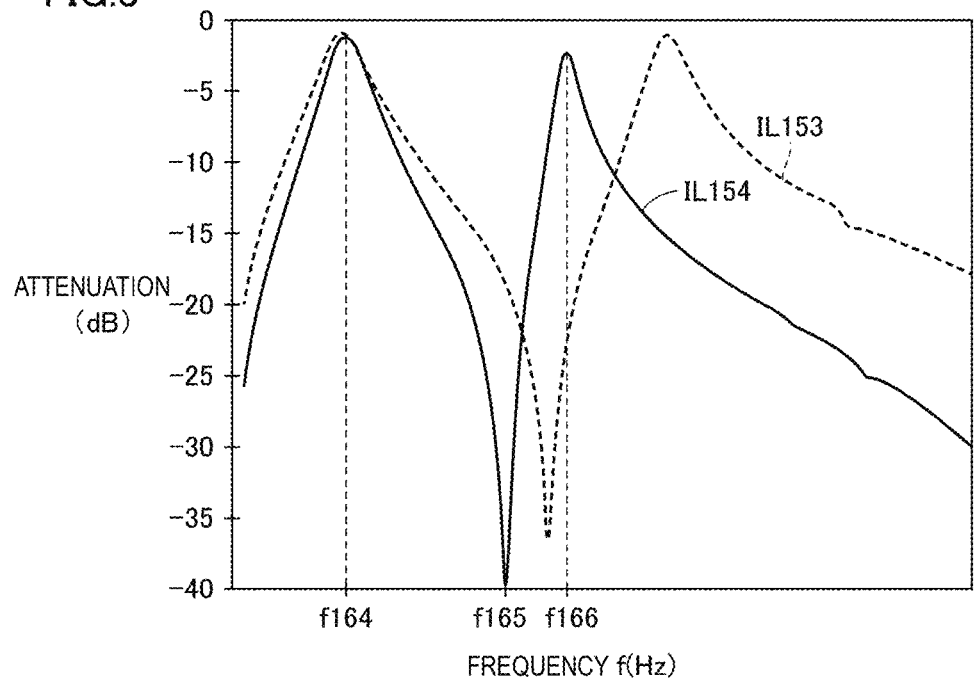
FIG. 8 is a diagram illustrating the original insertion loss of the band pass filter in FIG. 6 and an insertion loss obtained when the area of the capacitor electrode in FIG. 6 is changed.

FIG. 8 is a diagram illustrating the original insertion loss IL153 of the band pass filter 1 in FIG. 6 and the insertion loss IL154 obtained when the area of the capacitor electrode 132 in FIG. 6 is increased. When the area of the capacitor electrode 132 increases, the capacitance of the capacitor C122 increases. As a result, the characteristics of the band pass filter 1 change and the insertion loss changes from IL153 to IL154 as illustrated in FIG. 8. By changing the area of the capacitor electrode 132, the characteristics of the band pass filter 1 can be adjusted to desired characteristics.

Modification of First Preferred embodiment

In the first preferred embodiment, the case where a common capacitor electrode portion is defined by a single capacitor electrode has been described. In a modification of the first preferred embodiment, the case where a common capacitor electrode portion is defined by two capacitor electrodes will be described.

Figure 9:
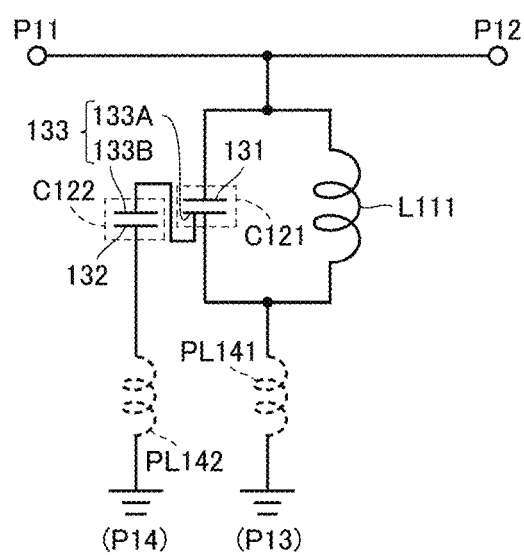
FIG. 9 is an equivalent circuit diagram of a band pass filter that is an example electronic component that is a modification of a first preferred embodiment of the present invention.

FIG. 9 is an equivalent circuit diagram of a band pass filter 1A that is an exemplary electronic component that is a modification of the first preferred embodiment. The band pass filter 1A differs from the band pass filter 1 illustrated in FIG. in that the capacitor electrode 130 is replaced by a common capacitor electrode portion 133. The remaining configuration of the band pass filter 1A is the same or substantially the same as that of the band pass filter 1, and the description thereof will therefore be omitted.

As illustrated in FIG. 9, the common capacitor electrode portion 133 includes capacitor electrodes 133A and 133B. The capacitor electrode 133A is connected to the capacitor electrode 133B. The capacitor electrode 133A is connected to the terminal P13. The capacitor electrode 133A defines the capacitor C121 along with the capacitor electrode 131.

The capacitor electrode 133B defines the capacitor C122 along with the capacitor electrode 132.

The sum of the inductance of the path from the capacitor electrode 133A to the capacitor electrode 133B and the inductance of the path from the capacitor electrode 132 to the point of connection between the ground and the terminal P14 is lower than the inductance of the path from the capacitor electrode 133A to the point of connection between the ground and the terminal P13. Since the combined impedance of a parasitic inductor defined at the path from the capacitor electrode 133A to the capacitor electrode 133B and the parasitic inductor PL142 is lower than the impedance of the parasitic inductor PL141, the delay in signal transmission in the band pass filter 1A can be reduced or prevented. As a result, the deviation of the characteristics of the band pass filter 1A from desired characteristics can be reduced or prevented.

With an electronic component according to the first preferred embodiment and an electronic component that is a modification of the first preferred embodiment, the deviation of the characteristics of the electronic components from desired characteristics can be reduced or prevented.

Second Preferred Embodiment

In a second preferred embodiment of the present invention, as an example of an electronic component according to the present invention, a balun defined by a laminate including a plurality of dielectrics will be described.

Figure 10:
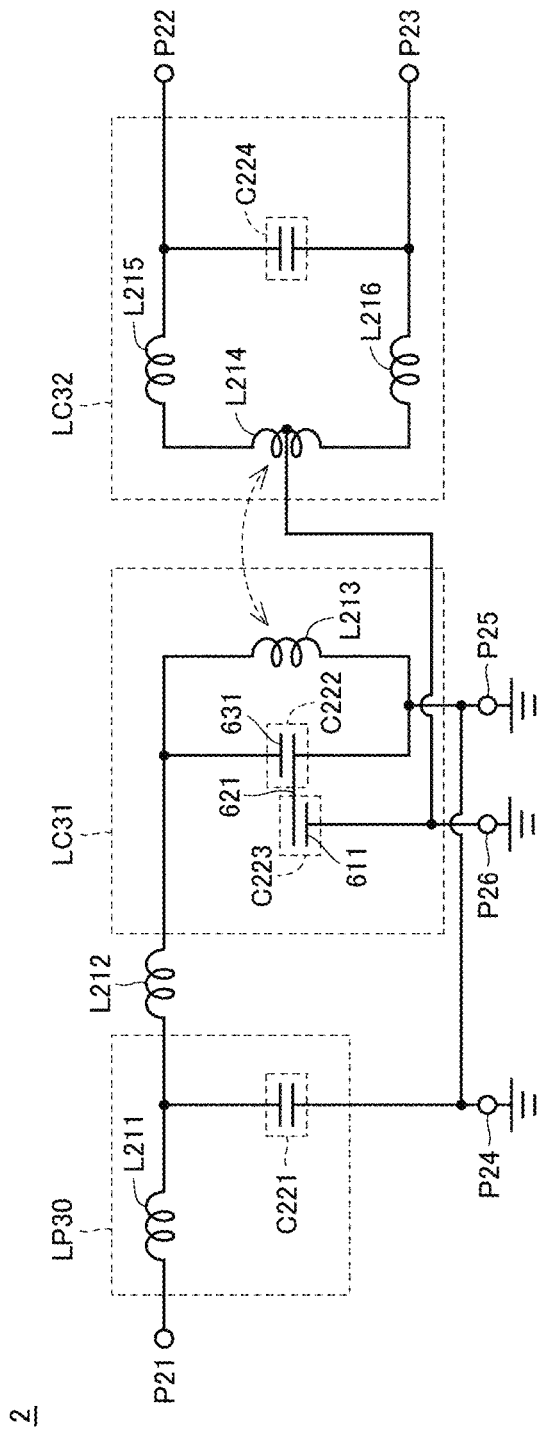
FIG. 10 is an equivalent circuit diagram of a balun that is an example of an electronic component according to a second preferred embodiment of the present invention.

FIG. 10 is an equivalent circuit diagram of a balun 2 that is an example of an electronic component according to the second preferred embodiment. The balun 2 converts between a balanced signal and an unbalanced signal at a frequency f200. That is, the balun 2 is a band pass filter having a frequency band around the frequency f200 as a pass band. A balanced signal is made up of two signals that have the same or substantially the same maximum amplitude value and are 180° out of phase with each other. An unbalanced signal is a signal having an amplitude based on the ground potential. As illustrated in FIG. 10, the balun 2 includes terminals P21 to P26, LC parallel resonators LC31 and LC32, a low pass filter LP30, and an inductor L212.

The terminal P21 is an input/output terminal for unbalanced signals and is connected to an antenna (not illustrated). Each of the terminals P22 and P23 is an input/output terminal for balanced signals and is connected to an integrated circuit (IC) (not illustrated). The phase difference between a signal output from the terminal P22 and a signal output from the terminal P23 is 180°. The phase difference between a signal input into the terminal P22 and a signal input into the terminal P23 is 180°. The terminals P24 to P26 are grounding terminals connected to the ground.

Between the terminal P21 and the grounding terminal P25, the low pass filter LP30, the inductor L212, and the LC parallel resonator LC31 are connected in series to each other in this order in a direction from the terminal P21 to the grounding terminal P25.

The low pass filter LP30 is connected between the terminal P21 and the inductor L212. The low pass filter LP30 includes an inductor L211 and a capacitor C221. The inductor L211 is connected between the terminal P21 and the inductor L212. The capacitor C221 is connected between the inductor L211 and the grounding terminal P24. The grounding terminal P24 is connected to the terminal P25. The low pass filter LP30 passes a signal of the frequency f200 and reduces the harmonic of the signal of the frequency f200. The harmonic of a signal of a certain frequency is a signal of a frequency that is an integral multiple of the frequency. Examples of the source of the harmonic of a signal of the frequency f200 include an IC (not illustrated) to which the terminals P22 and P23 are connected and an external device (not illustrated) connected to the terminal P21.

The LC parallel resonator LC31 is connected between the inductor L212 and the grounding terminal P25. The resonant frequency of the LC parallel resonator LC31 is f200. The LC parallel resonator LC31 includes an inductor L213 and capacitor conductive patterns 611, 621, and 631 that are capacitor electrodes. The inductor L213 is connected between the inductor L212 and the grounding terminal P25. The capacitor conductive pattern 611 is connected to the grounding terminal P26. The capacitor conductive pattern 621 is connected to the grounding terminal P25. The capacitor conductive pattern 631 is connected to the inductor L212. The capacitor conductive pattern 631 defines a capacitor C222 along with the capacitor conductive pattern 621. The capacitor conductive pattern 611 defines a capacitor C223 along with the capacitor conductive pattern 621. The inductor L213 and the capacitor C222 are connected in parallel between the inductor L212 and the grounding terminal P25.

The inductor L212 is connected between the inductor L211 and the capacitor C222. The inductor L212 defines a low pass filter along with the capacitor C222. This low pass filter passes a signal of the frequency f200 and reduces the harmonic of the signal of the frequency f200.

The LC parallel resonator LC32 is connected between the terminals P22 and P23. The resonant frequency of the LC parallel resonator LC32 is the frequency f200. The LC parallel resonator LC32 includes a capacitor C224 and inductors L214 to L216. The capacitor C224 and the inductor L214 are connected in parallel between the terminals P22 and P23. The inductor L214 is magnetically coupled to the inductor L213.

The inductor L215 is connected between one electrode of the capacitor C224 and one end of the inductor L214. The inductor L216 is connected between the other electrode of the capacitor C224 and the other end of the inductor L214. The inductance of the inductor L215 is equal to the inductance of the inductor L216. The inductors L215 and L216 are provided to adjust the impedance of the LC parallel resonator LC32 to a desired value. The inductors L214 to L216 may be defined by a single inductor.

In a case where an unbalanced signal of the frequency f200 is input into the terminal P21, the impedance of the LC parallel resonator LC31 when the terminal P25 is viewed from the terminal P21 via the LC parallel resonator LC31 is very high (approaches infinity) because the frequency f200 is the resonant frequency of the LC parallel resonator LC31. The unbalanced signal transmitted from the terminal P21 is less likely to be transmitted to the terminal P25 via the LC parallel resonator LC31. As a result, the degree of the magnetic coupling between the inductors L213 and L214 is increased and the majority of the unbalanced signals of the frequency f200 from the terminal P21 are transmitted from the inductor L213 to the inductor L214 via the magnetic coupling.

Since the frequency f200 is also the resonant frequency of the LC parallel resonator LC32, the impedance of the LC parallel resonator LC32 when the terminal P23 is viewed from the terminal P22 via the LC parallel resonator LC32 is very high (approaches infinity). The signal output from the end portion of the inductor L214 on the side of the terminal P22 is less likely to be transmitted to the terminal P23 via the LC parallel resonator LC32. As a result, the majority of the signals output from the end portion of the inductor L214 on the side of the terminal P22 are transmitted to the terminal P22 via the inductor L215.

The impedance of the LC parallel resonator LC32 when the terminal P22 is viewed from the terminal P23 via the LC parallel resonator LC32 is also very high (approaches infinity). The signal output from the end portion of the inductor L214 on the side of the terminal P23 is less likely to be transmitted to the terminal P22 via the LC parallel resonator LC32. As a result, the majority of the signals output from the end portion of the inductor L214 on the side of the terminal P23 are transmitted to the terminal P23 via the inductor L216.

The phase difference between signals output from both end portions of the inductor L214 is 180°. The inductance of the inductor L215 is equal or substantially equal to the inductance of the inductor L216. The phase shift when a signal passes through the inductor L215 is the same or substantially the same as the phase shift when a signal passes through the inductor L216. The phase difference between a signal that is transmitted from the end portion of the inductor L214 on the side of the terminal P22 via the inductor L215 and is output from the terminal P22 and a signal that is transmitted from the end portion of the inductor L214 on the side of the terminal P23 via the inductor L216 and is output from the terminal P23 is therefore still 180°. That is, the balanced signal of the frequency f200 is output from the terminals P22 and P23.

In a case where the balanced signal of the frequency f200 is input into the terminals P22 and P23, the degree of the magnetic coupling between the inductors L213 and L214 is increased because the frequency f200 is the resonant frequency of the LC parallel resonators LC31 and LC32. As a result, the balanced signal of the frequency f200 is transmitted from the inductor L214 to the inductor L213 via the magnetic coupling and is output from the terminal P21 as the unbalanced signal of the frequency f200.

Figure 11:
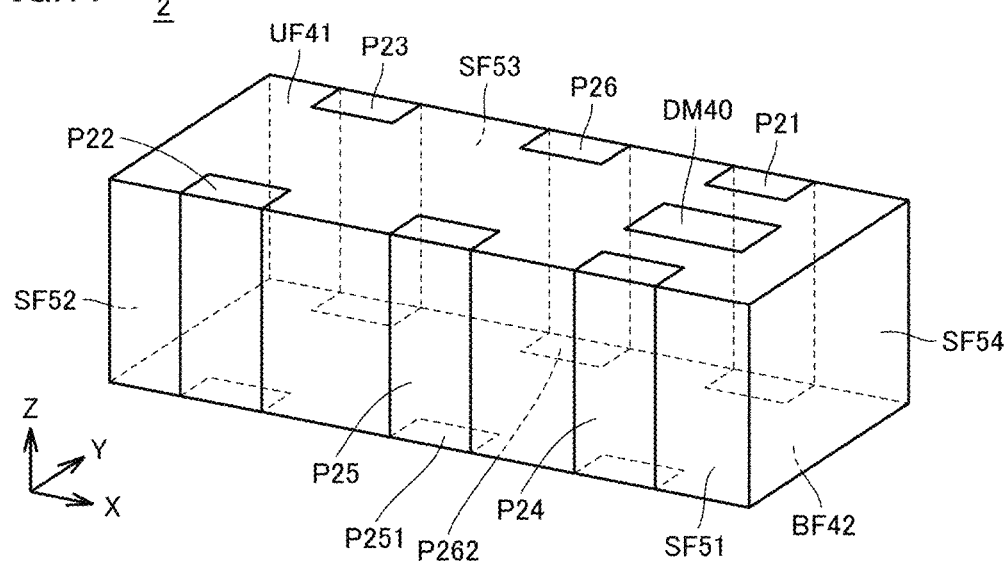
FIG. 11 is an external perspective view of the balun illustrated in FIG. 10.

FIG. 11 is an external perspective view of the balun 2 illustrated in FIG. 10. As illustrated in FIG. 11, the balun 2 is preferably, for example, a rectangular or substantially rectangular parallelepiped. Among surfaces of the balun 2, surfaces perpendicular or substantially perpendicular to the Z-axis (lamination) direction are defined as an upper surface UF41 and a bottom surface BF42. On the upper surface UF41, a direction identification mark DM40 is provided to identify the installation direction of the balun 2. The bottom surface BF42 is connected to a substrate (not illustrated).

Among the surfaces of the balun 2 which are parallel or substantially parallel to the lamination direction, surfaces parallel or substantially parallel to ZX plane are defined as side surfaces SF51 and SF53. Among the surfaces of the balun 2 which are parallel or substantially parallel to the lamination direction, surfaces parallel or substantially parallel to YZ plane are defined as side surfaces SF52 and SF54. Each of the terminals P21, P23, and P26 extends from the upper surface UF41 to the bottom surface BF42 via the side surface SF53. A portion of the grounding terminal P26 on the bottom surface BF42 is defined as a portion P262. Each of the terminals P22, P24, and P25 extends from the upper surface UF41 to the bottom surface BF42 via the side surface SF52. A portion of the grounding terminal P25 on the bottom surface BF42 is defined as a portion P251. The bottom surface BF42 is connected to a substrate (not illustrated), so that the portion P251 of the terminal P25 and the portion P262 of the terminal P26 are connected to the ground. Each of the terminals P21 to P26 can be regarded as a signal path with a length that is substantially equal to the thickness of the dielectric layers in the lamination direction. At each of the terminals P21 to P26, a parasitic inductor is provided.

Figure 12:
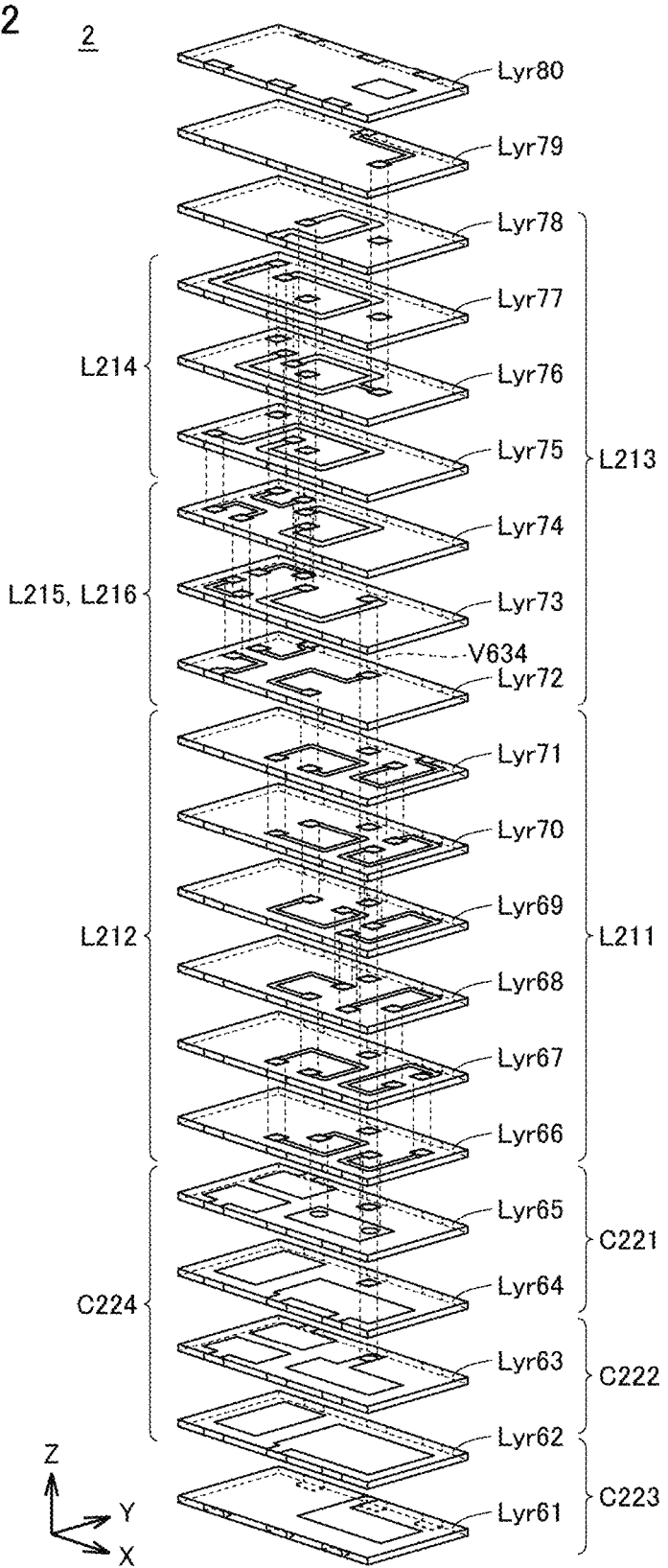
FIG. 12 is an exploded perspective view of the balun in FIG. 11 which illustrates the example laminated structure of the balun.

FIG. 12 is an exploded perspective view of the balun 2 in FIG. 11 which illustrates the exemplary laminated structure of the balun. As illustrated in FIG. 12, the balun 2 is a laminate in which dielectric layers Lyr61 to Lyr80 are laminated in the lamination direction.

Figure 13:
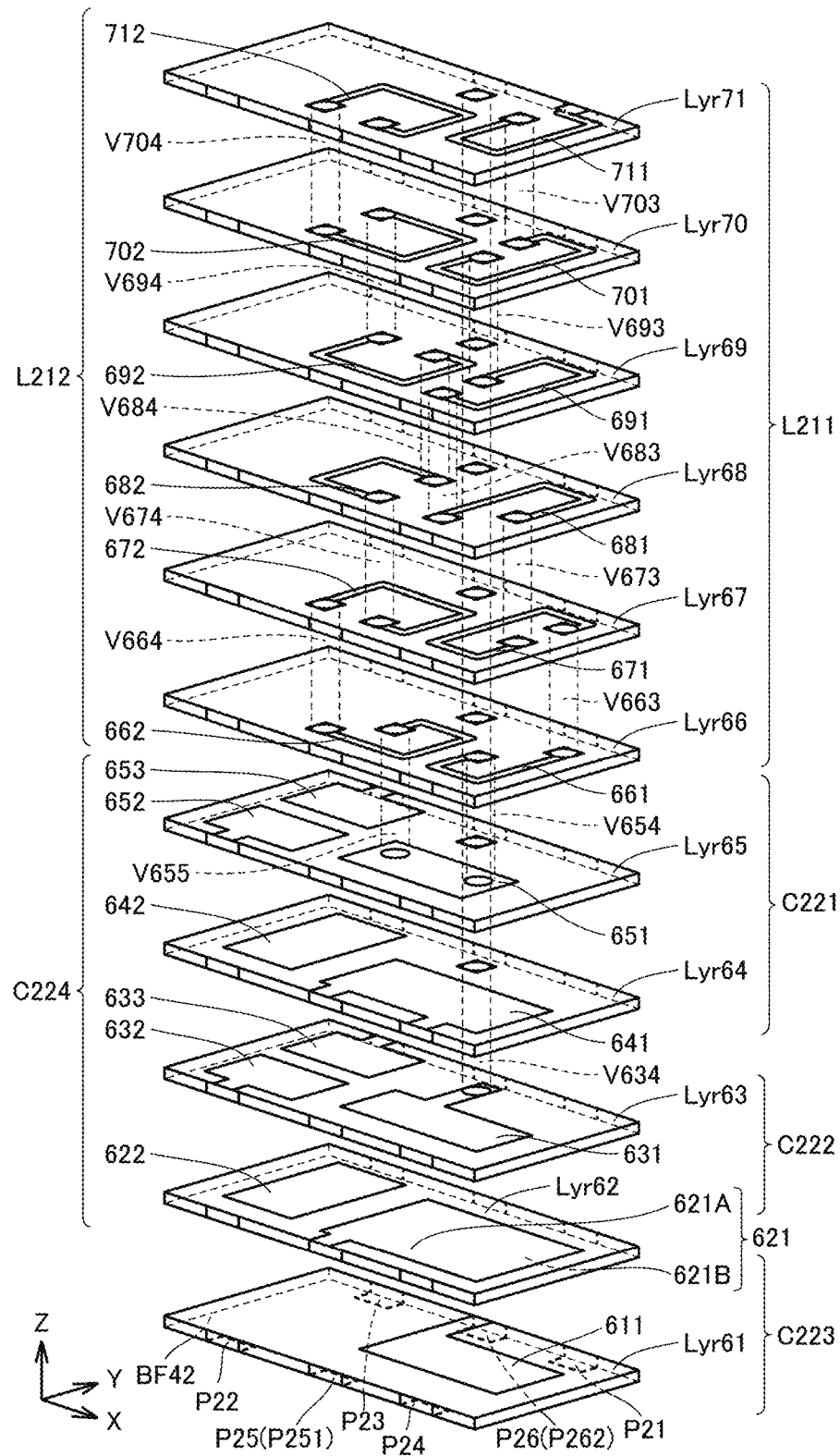
FIG. 13 is a diagram illustrating a portion of dielectric layers in FIG. 12.

FIG. 13 is a diagram illustrating the dielectric layers Lyr61 to Lyr71 in FIG. 12. Conductive patterns provided on the dielectric layers Lyr61 to Lyr71 will be described below with reference to FIG. 13 and with reference to FIG. 10 (equivalent circuit diagram) and FIG. 11 (external perspective view) as needed.

The dielectric layer Lyr61 includes the bottom surface BF42 to be connected to a substrate (not illustrated). The dielectric layer Lyr61 on which the portion P251 of the grounding terminal P25 and the portion P262 of the terminal P26 are disposed corresponds to a connection layer. On the dielectric layer Lyr61, the capacitor conductive pattern 611 is provided. The capacitor conductive pattern 611 is connected to the grounding terminal P26 (see FIGS. 10 and 11).

On the dielectric layer Lyr62, the capacitor conductive patterns 621 and 622 are provided. The capacitor conductive pattern 621 is connected to the grounding terminal P25. The capacitor conductive pattern 621 defines the capacitor C223 along with the capacitor conductive pattern 611 (see FIG. 10). The dielectric layer Lyr62 corresponds to a common capacitor layer.

On the dielectric layer Lyr63, the capacitor conductive patterns 631 to 633 are provided. The capacitor conductive pattern 631 defines the capacitor C222 along with the capacitor conductive pattern 621 (see FIG. 10). The capacitor conductive patterns 632 and 633 are connected to the terminals P22 and P23, respectively (see FIGS. 10 and 11). The dielectric layer Lyr63 corresponds to a capacitor layer.

The dielectric layer Lyr62 (common capacitor layer) is disposed between the dielectric layer Lyr63 (capacitor layer) and the dielectric layer Lyr61 (connection layer). The inductance of the path from the capacitor conductive pattern 611 to the portion P262 is lower than that of the path from the capacitor conductive pattern 621 to the portion P251.

On the dielectric layer Lyr64, capacitor conductive patterns 641 and 642 are provided. The capacitor conductive pattern 641 is connected to the terminals P24 and P25 (see FIGS. 10 and 11).

On the dielectric layer Lyr65, capacitor conductive patterns 651 to 653 are provided. The capacitor conductive pattern 651 defines the capacitor C221 along with the capacitor conductive pattern 641 (see FIG. 10). The capacitor conductive patterns 652 and 653 are connected to the terminals P22 and P23, respectively (see FIGS. 10 and 11). The capacitor conductive patterns 652 and 653 define the capacitor C224 (see FIG. 10) along with a capacitor conductive pattern 622 and the capacitor conductive patterns 632, 633, and 642.

On the dielectric layer Lyr66, inductor conductive patterns 661 and 662 are provided. The inductor conductive patterns 661 and 662 are connected to the capacitor conductive pattern 651 by via conductive patterns V654 and V655, respectively.

On the dielectric layer Lyr67, inductor conductive patterns 671 and 672 are provided. The inductor conductive pattern 671 is connected to the inductor conductive pattern 661 via a via conductive pattern V663. The inductor conductive pattern 672 is connected to the inductor conductive pattern 662 via a via conductive pattern V664.

On the dielectric layer Lyr68, inductor conductive patterns 681 and 682 are provided. The inductor conductive pattern 681 is connected to the inductor conductive pattern 671 via a via conductive pattern V673. The inductor conductive pattern 682 is connected to the inductor conductive pattern 672 via a via conductive pattern V674.

On the dielectric layer Lyr69, inductor conductive patterns 691 and 692 are provided. The inductor conductive pattern 691 is connected to the inductor conductive pattern 681 via a via conductive pattern V683. The inductor conductive pattern 692 is connected to the inductor conductive pattern 682 via a via conductive pattern V684.

On the dielectric layer Lyr70, inductor conductive patterns 701 and 702 are provided. The inductor conductive pattern 701 is connected to the inductor conductive pattern 691 via a via conductive pattern V693. The inductor conductive pattern 702 is connected to the inductor conductive pattern 692 via a via conductive pattern V694.

On the dielectric layer Lyr71, inductor conductive patterns 711 and 712 are provided. The inductor conductive pattern 711 is connected to the terminal P21 (see FIGS. 10 and 11). The inductor conductive pattern 711 is connected to the inductor conductive pattern 701 via a via conductive pattern V703. The inductor conductive pattern 712 is connected to the inductor conductive pattern 702 via a via conductive pattern V704.

The inductor conductive patterns 661, 671, 681, 691, 701, and 711 and the via conductive patterns V663, V673, V683, V693, and V703 define the inductor L211 (see FIG. 10). The inductor conductive patterns 662, 672, 682, 692, 702, and 712 and the via conductive patterns V664, V674, V684, V694, and V704 define the inductor L212 (see FIG. 10).

Figure 14:
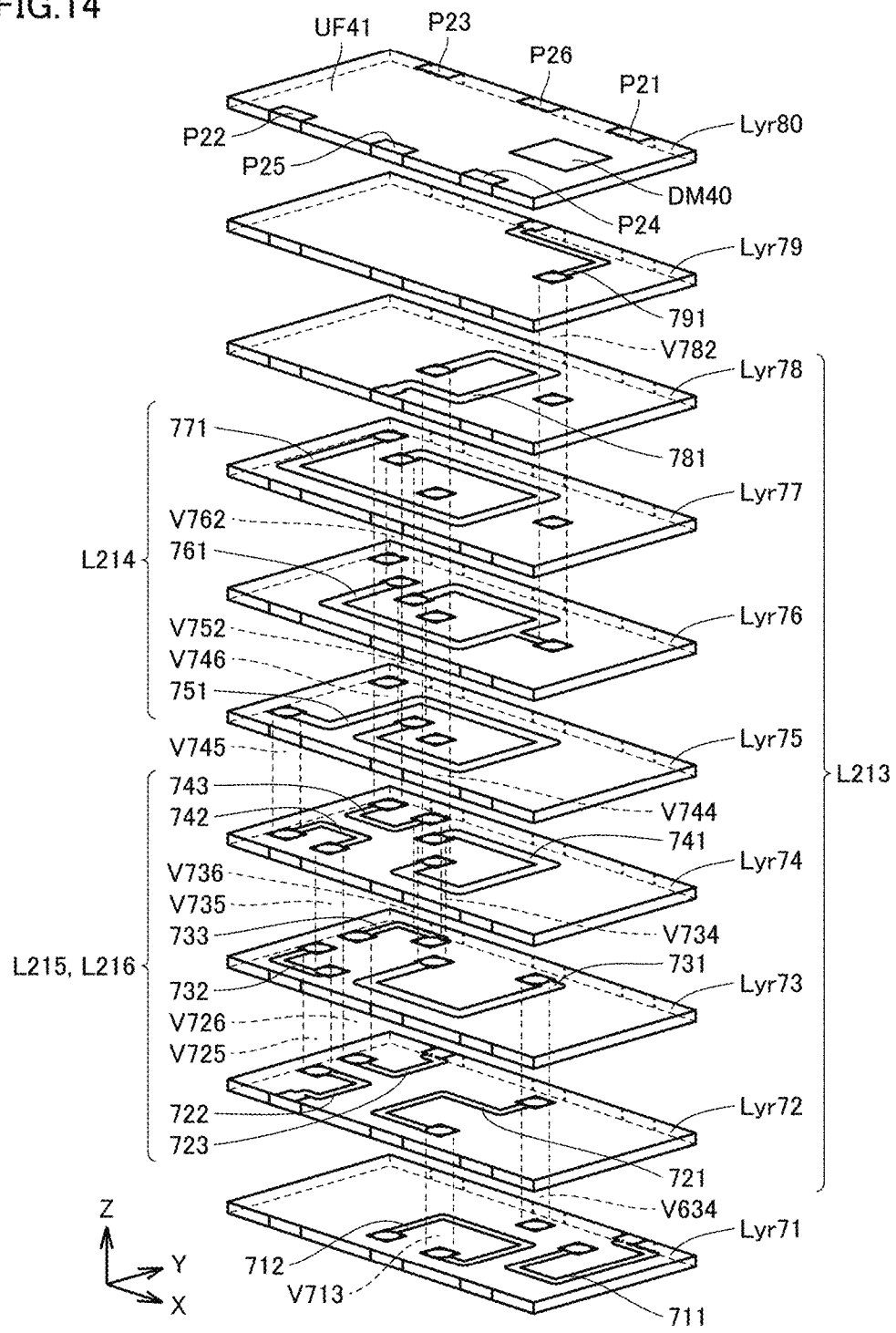
FIG. 14 is a diagram illustrating the other part of the dielectric layers in FIG. 12.

FIG. 14 is a diagram illustrating the dielectric layers Lyr71 to Lyr80 in FIG. 12. Conductive patterns provided on the dielectric layers Lyr72 to Lyr79 will be described below with reference to FIG. 14 and with reference to FIG. 10 (equivalent circuit diagram), FIG. 11 (external perspective view), FIG. 12 (the dielectric layers Lyr61 to Lyr80), and FIG. 13 (the dielectric layer Lyr61 to Lyr71) as needed.

On the dielectric layer Lyr72, inductor conductive patterns 721 to 723 are provided. The inductor conductive pattern 721 is connected to the inductor conductive pattern 712 via a via conductive pattern V713. The inductor conductive pattern 721 is connected to the capacitor conductive pattern 631 (see FIGS. 13 and 12) via a via conductive pattern V634. The inductor conductive pattern 722 is connected to the terminal P22 (see FIGS. 10 and 11). The inductor conductive pattern 723 is connected to the terminal P23 (see FIGS. 10 and 11).

On the dielectric layer Lyr73, inductor conductive patterns 731 to 733 are provided. The inductor conductive pattern 731 is connected to the inductor conductive pattern 721 via a via conductive pattern V634. The inductor conductive pattern 732 is connected to the inductor conductive pattern 722 via a via conductive pattern V725. The inductor conductive pattern 733 is connected to the inductor conductive pattern 723 via a via conductive pattern V726.

On the dielectric layer Lyr74, inductor conductive patterns 741 to 743 are provided. The inductor conductive pattern 741 is connected to the inductor conductive pattern 731 via a via conductive pattern V734. The inductor conductive pattern 742 is connected to the inductor conductive pattern 732 via a via conductive pattern V735. The inductor conductive pattern 743 is connected to the inductor conductive pattern 733 via a via conductive pattern V736.

The inductor conductive patterns 722, 732, and 742 and the via conductive patterns V725 and V735 define the inductor L215. The inductor conductive patterns 723, 733, and 743 and the via conductive patterns V726 and V736 define the inductor L216.

On the dielectric layer Lyr75, an inductor conductive pattern 751 is provided. The inductor conductive pattern 751 is connected to the inductor conductive pattern 742 via a via conductive pattern V745.

On the dielectric layer Lyr76, an inductor conductive pattern 761 is provided. The inductor conductive pattern 761 is connected to the inductor conductive pattern 751 via a via conductive pattern V752.

On the dielectric layer Lyr77, an inductor conductive pattern 771 is provided. The inductor conductive pattern 771 is connected to the inductor conductive pattern 761 via a via conductive pattern V762. The inductor conductive pattern 771 is connected to the inductor conductive pattern 743 via a via conductive pattern V746.

On the dielectric layer Lyr78, an inductor conductive pattern 781 is provided. The inductor conductive pattern 781 is connected to the terminal P25 (see FIGS. 10 and 11). The inductor conductive pattern 781 is connected to the inductor conductive pattern 741 via a via conductive pattern V744.

On the dielectric layer Lyr79, a line conductive pattern 791 is provided. The line conductive pattern 791 is connected to the terminal P26 (see FIGS. 10 and 11). The line conductive pattern 791 is connected to the inductor conductive pattern 761 via a via conductive pattern V782.

The inductor conductive patterns 721, 731, 741, and 781, a portion of the via conductive pattern V634 which connects the inductor conductive patterns 721 and 731, and the via conductive patterns V734 and V744 define the inductor L213 (see FIG. 10).

Figure 15:
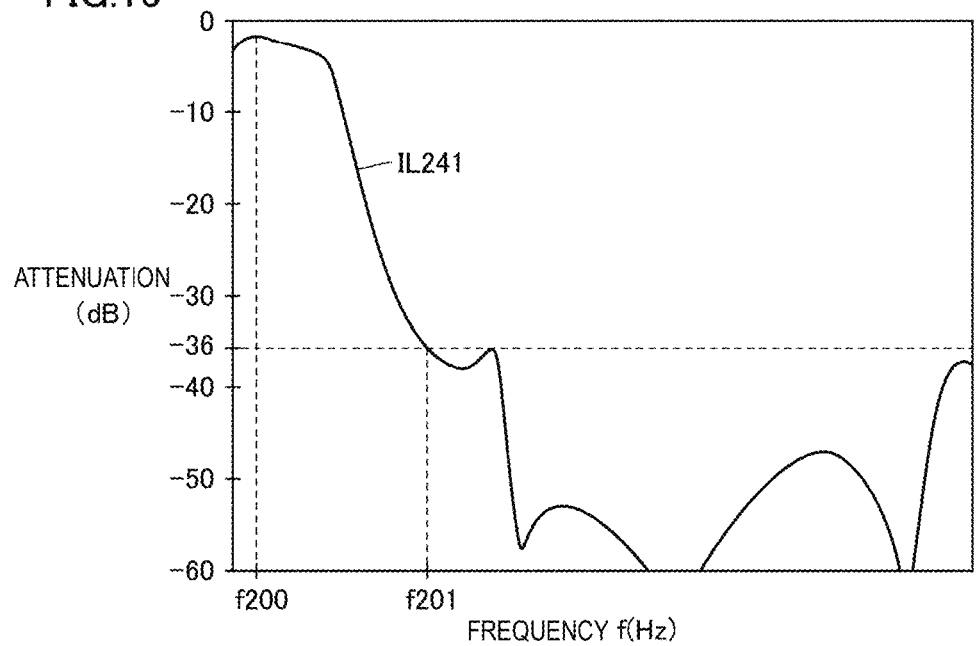
FIG. 15 is a diagram illustrating the insertion loss of the balun in FIG. 10.

FIG. 15 is a diagram illustrating an insertion loss IL241 of the balun 2 in FIG. 10. The insertion loss IL241 represents the portion of signals transmitted to the terminal P22 in signals input into the terminal P21. In the frequency band illustrated in FIG. 15, the insertion loss IL241 is the minimum at a frequency near the frequency f200. When the frequency f exceeds f200, the insertion loss IL241 increases and exceed approximately 36 dB at the frequency f201. When the frequency f exceeds f201, the attenuation of approximately 36 dB or more is maintained although the insertion loss IL241 is repeatedly increases and decreases. Signals of frequencies near the frequency f200 easily pass through the balun 2. That is, the deviation of the characteristics of the balun 2 from desired characteristics required for band pass filters having frequency bands near the frequency f200 as the respective pass bands is reduced or prevented.

Figure 16:
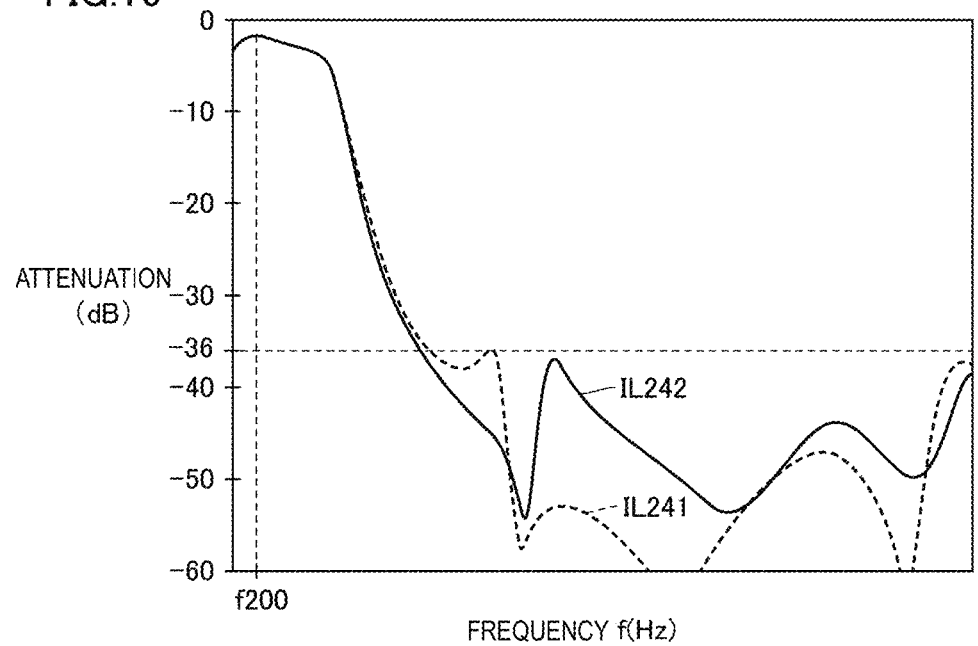
FIG. 16 is a diagram illustrating the original insertion loss of the balun in FIG. 13 and an insertion loss obtained when the area of a capacitor conductive pattern in FIG. 13 is changed.
Figure 17:
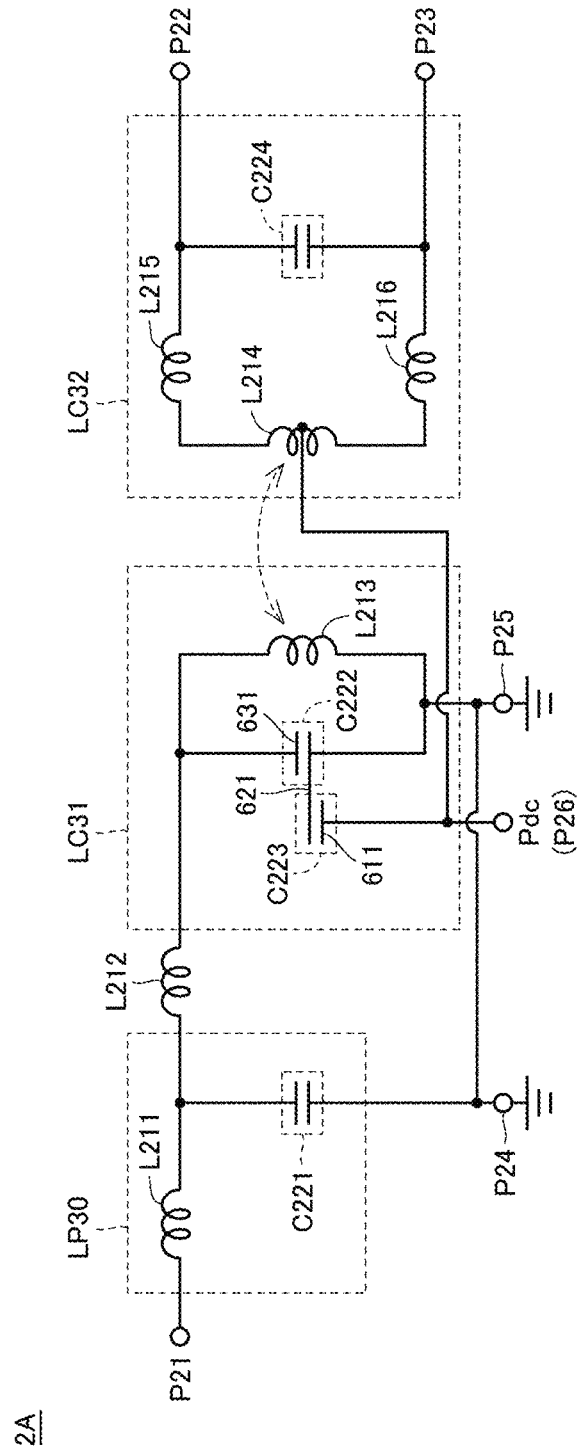
FIG. 17 is an equivalent circuit diagram of a balun that is an example electronic component that is a modification of the second preferred embodiment of the present invention.

FIG. 16 is a diagram illustrating the original insertion loss IL241 of the balun 2 in FIG. 13 and an insertion loss IL242 obtained when the area of the capacitor conductive pattern 611 in FIG. 13 is reduced. When the area of the capacitor conductive pattern 611 is reduced, the capacitance of the capacitor C223 decreases. As a result, the characteristics of the balun 2 changes and the insertion loss changes from IL241 to IL242 as illustrated in FIG. 16. By changing the area of the capacitor conductive pattern 611, the characteristics of the balun 2 can be adjusted to desired characteristics.

In the second preferred embodiment, the configuration in which the capacitor conductive patterns 611 and 621 are connected to the portions of the grounding terminals P26 and P25 on the side surfaces, respectively, has been described as illustrated in FIG. 13. The way to connect the capacitor conductive patterns 611 and 621 to the grounding terminals is not limited to the way illustrated in FIG. 13. For example, the configuration may be provided in which the capacitor conductive patterns 611 and 621 are connected to other LGAs (land grid arrays) regularly arranged on the bottom surface BF42 by via conductive patterns extending in the lamination direction.

In the second preferred embodiment, the case where the terminal P26 illustrated in FIG. 10 is a grounding terminal has been described. Similar to a balun 2A illustrated in FIG. 17, the terminal P26 can be used as a DC feed terminal Pdc. Since the inductor L214 is connected to the DC feed terminal Pdc. Since both ends of the inductor L214 are electrically connected to the terminals P22 and P23, the DC potentials of the terminals P22 and P23 can be adjusted by changing a voltage to be applied to the DC feed terminal Pdc.

With an electronic component according to the second preferred embodiment and an electronic component that is a modification of the second preferred embodiment, the deviation of the characteristics of the electronic components from desired characteristics can be reduced or prevented.

Third Preferred Embodiment

In the first and second preferred embodiments, the case where the number of alternatives to a signal path in an electronic component according to a preferred embodiment is one has been described. The number of alternatives to a signal path in an electronic component according to a preferred embodiment may be two or more. In the third preferred embodiment, the case where the number of alternatives to a signal path in an electronic component is two will be described.

Figure 18:
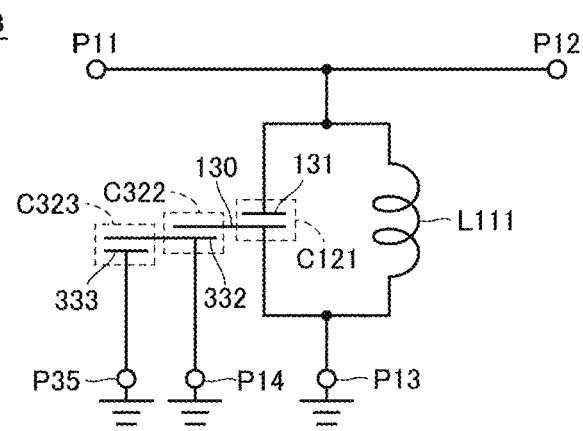
FIG. 18 is an equivalent circuit diagram of a band pass filter that is an example of an electronic component according to a third preferred embodiment of the present invention.

FIG. 18 is an equivalent circuit diagram of a band pass filter 3 that is an example of an electronic component according to the third preferred embodiment. The band pass filter 3 differs from the band pass filter 1 in FIG. 1 in that the capacitor electrode 132 is replaced by a capacitor electrode 332 and a capacitor electrode 333 and a terminal P35 are added. The remaining configuration of the band pass filter 3 is the same or substantially the same as that of the band pass filter 1, and the description thereof will therefore be omitted.

As illustrated in FIG. 18, the capacitor electrode 332 is connected to the terminal P14. The capacitor electrode 333 is connected to the terminal P35. The terminal P35 is a grounding terminal connected to the ground. The capacitor electrode 332 defines the capacitor C322 along with the capacitor electrode 130. The capacitor electrode 333 defines a capacitor C323 along with the capacitor electrode 332. In FIG. 18, an electrode common to the capacitors C322 and C323 is illustrated as the single capacitor electrode 332.

The inductance of the path from the capacitor electrode 332 to the point of connection between the ground and the terminal P14 is lower than that of the path from the capacitor electrode 130 to the point of connection between the ground and the terminal P13. The inductance of the path from the capacitor electrode 333 to the point of connection between the ground and the terminal P35 is lower than that of the path from the capacitor electrode 332 to the point of connection between the ground and the terminal P14. The delay in signal transmission in the band pass filter 3 is therefore reduced or prevented. As a result, the deviation of the characteristics of the band pass filter 3 from desired characteristics can be reduced or prevented.

Modification of Third Preferred embodiment

Figure 19:
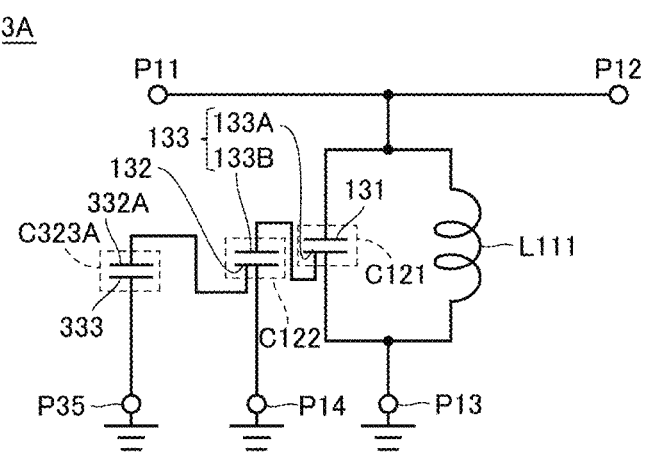
FIG. 19 is an equivalent circuit diagram of a band pass filter 3A that is an example electronic component that is a modification of the third preferred embodiment of the present invention.

FIG. 19 is an equivalent circuit diagram of a band pass filter 3A that is an exemplary electronic component that is a modification of the third preferred embodiment. The band pass filter 3A differs from the band pass filter 1A in FIG. 9 in that a capacitor electrode 332A, the capacitor electrode 333, and the terminal P35 are added. The remaining configuration of the band pass filter 3A is the same or substantially the same as that of the band pass filter 1A, and the description thereof will therefore be omitted.

As illustrated in FIG. 19, the capacitor electrode 333 is connected to the terminal P35. The terminal P35 is a grounding terminal connected to the ground. The capacitor electrode 332A is connected to the capacitor electrode 132. The capacitor electrode 333 defines a capacitor C323A along with the capacitor electrode 332A.

The sum of the inductance of the path from the capacitor electrode 132 to the capacitor electrode 332A and the inductance of the path from the capacitor electrode 333 to the point of connection between the ground and the terminal P35 is lower than that of the path from the capacitor electrode 132 to the point of connection between the ground and the terminal P14. The delay in signal transmission in the band pass filter 3A is therefore reduced or prevented. As a result, the deviation of the characteristics of the band pass filter 3A from desired characteristics can be reduced or prevented.

With an electronic component according to the third preferred embodiment and an electronic component that is a modification of the third preferred embodiment, the deviation of the characteristics of an electronic component from desired characteristics can be reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component in which a plurality of dielectric layers are laminated in a lamination direction, the electronic component comprising:
    a first terminal;
    a second terminal;
    a common capacitor electrode portion electrically connected to the first terminal;
    a first capacitor electrode; and
    a second capacitor electrode electrically connected to the second terminal; wherein
        the common capacitor electrode portion includes a third capacitor electrode electrically connected to the first terminal;
        the first capacitor electrode defines a first capacitor along with the third capacitor electrode;
        the second capacitor electrode defines a second capacitor along with the third capacitor electrode;
        the dielectric layers include a connection layer where a first portion of the first terminal and a second portion of the second terminal are disposed; and
        an inductance of a path from the second capacitor electrode to the second portion is lower than an inductance of a path from the third capacitor electrode to the first portion.

2. An electronic component in which a plurality of dielectric layers are laminated in a lamination direction, the electric component comprising:
    a first terminal;
    a second terminal;
    a common capacitor electrode portion electrically connected to the first terminal;
    a first capacitor electrode; and
    a second capacitor electrode electrically connected to the second terminal; wherein
        the common capacitor electrode portion includes a third capacitor electrode electrically connected to the first terminal and a fourth capacitor electrode electrically connected to the third capacitor electrode;
        the first capacitor electrode defines a first capacitor along with the third capacitor electrode;
        the second capacitor electrode defines a second capacitor along with the fourth capacitor electrode;
        the dielectric layers include a connection layer where a first portion of the first terminal and a second portion of the second terminal are disposed; and
        a sum of an inductance of a path from the third capacitor electrode to the fourth capacitor electrode and an inductance of a path from the second capacitor electrode to the second portion is lower than an inductance of a path from the third capacitor electrode to the first portion.

3. The electronic component according to claim 1, wherein
    the dielectric layers further include a capacitor layer where the first capacitor electrode is disposed and a common capacitor layer where the common capacitor electrode portion is disposed; and
    the common capacitor layer is disposed between the capacitor layer and the second capacitor electrode.

4. The electronic component according to claim 1, wherein the second capacitor electrode is disposed at the connection layer.

5. The electronic component according to claim 1, further comprising a first inductor electrically connected between the first capacitor electrode and the first terminal.

6. The electronic component according to claim 5, further comprising:
    a third terminal that receives unbalanced signals;
    a fourth terminal and a fifth terminal that receive balanced signals;
    a third capacitor electrically connected between the fourth terminal and the fifth terminal; and
    a second inductor that is magnetically coupled to the first inductor and is electrically connected, between the fourth terminal and the fifth terminal, in parallel with the third capacitor; wherein
        the first inductor and the first capacitor are electrically connected in parallel with each other between the third terminal and the first terminal.

7. The electronic component according to claim 1, wherein each of the first terminal and the second terminal is electrically connected to a ground.

8. The electronic component according to claim 7, wherein
    the first terminal is a grounding terminal; and
    the second terminal is a DC feed terminal.

9. The electronic component according to claim 1, further comprising:
    a sixth terminal; and
    a fifth capacitor electrode electrically connected to the sixth terminal; wherein
        the fifth capacitor electrode defines a third capacitor along with the second capacitor electrode;
        a third portion of the sixth terminal is disposed at the connection layer; and
        an inductance of a path from the fifth capacitor electrode to the third portion is lower than an inductance of a path from the second capacitor electrode to the second portion.

10. The electronic component according to claim 2, further comprising:
a sixth terminal;
a fifth capacitor electrode electrically connected to the sixth terminal; and
a sixth capacitor electrode electrically connected to the second capacitor electrode; wherein
the fifth capacitor electrode defines a third capacitor along with the sixth capacitor electrode;
a third portion of the sixth terminal is disposed at the connection layer; and
a sum of an inductance of a path from the second capacitor electrode to the sixth capacitor electrode and an inductance of a path from the fifth capacitor electrode to the third portion is lower than an inductance of a path from the second capacitor electrode to the second portion.

11. A balun including the electronic component according to claim 6, wherein
a phase difference between a signal input into the third terminal and a signal input into the fourth terminal is 180°; and
the fifth terminal is electrically connected to the ground.

12. The electronic component according to claim 6, wherein
a phase difference of signals output from two end portions of the second inductor is 180°.

13. A balun including the electronic component according to claim 9, wherein
the balun has a rectangular or substantially rectangular parallelepiped shape;
three of the first terminal, the second terminal, the third terminal, the fourth terminal, the fifth terminal, and the sixth terminal are provided on a first side surface of the rectangular parallelepiped shape; and
another three of the first terminal, the second terminal, the third terminal, the fourth terminal, the fifth terminal, and the sixth terminal are provided on a second side surface of the rectangular parallelepiped shape, the first side surface being parallel to the second side surface.

14. The electronic component according to claim 1, further comprising:
a third capacitor; wherein
a second common capacitor electrode portion is defined by the fourth capacitor electrode and a fifth capacitor electrode; and
the third capacitor is defined between the fifth capacitor electrode and a sixth capacitor electrode.

15. The electronic component according to claim 2, wherein
the dielectric layers further include a capacitor layer where the first capacitor electrode is disposed and a common capacitor layer where the common capacitor electrode portion is disposed; and
the common capacitor layer is disposed between the capacitor layer and the second capacitor electrode.

16. The electronic component according to claim 2, wherein the second capacitor electrode is disposed at the connection layer.

17. The electronic component according to claim 2, further comprising a first inductor electrically connected between the first capacitor electrode and the first terminal.

18. The electronic component according to claim 17, further comprising:
a third terminal that receives unbalanced signals;
a fourth terminal and a fifth terminal that receive balanced signals;
a third capacitor electrically connected between the fourth terminal and the fifth terminal; and
a second inductor that is magnetically coupled to the first inductor and is electrically connected, between the fourth terminal and the fifth terminal, in parallel with the third capacitor; wherein
the first inductor and the first capacitor are electrically connected in parallel with each other between the third terminal and the first terminal.

19. The electronic component according to claim 2, wherein each of the first terminal and the second terminal is electrically connected to a ground.

20. The electronic component according to claim 19, wherein
the first terminal is a grounding terminal; and
the second terminal is a DC feed terminal.

* * * * *